United States Patent
Zheng et al.

(10) Patent No.: US 12,183,754 B2
(45) Date of Patent: Dec. 31, 2024

(54) SINGLE-PHOTON AVALANCHE DIODES WITH DEEP TRENCH ISOLATION

(71) Applicant: GLOBALFOUNDRIES Singapore Pte. Ltd., Singapore (SG)

(72) Inventors: Ping Zheng, Singapore (SG); Eng Huat Toh, Singapore (SG); Eric Linardy, Singapore (SG); Kiok Boone Elgin Quek, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 343 days.

(21) Appl. No.: 17/410,025

(22) Filed: Aug. 24, 2021

(65) Prior Publication Data
US 2023/0065063 A1   Mar. 2, 2023

(51) Int. Cl.
*H01L 27/146* (2006.01)
*H01L 31/107* (2006.01)

(52) U.S. Cl.
CPC .... *H01L 27/1463* (2013.01); *H01L 27/14603* (2013.01); *H01L 27/14623* (2013.01); *H01L 27/1464* (2013.01); *H01L 27/14685* (2013.01); *H01L 27/14627* (2013.01); *H01L 31/107* (2013.01)

(58) Field of Classification Search
CPC ........... H01L 27/1463; H01L 27/14603; H01L 27/1464; H01L 31/107
See application file for complete search history.

(56) References Cited

U.S. PATENT DOCUMENTS

| | | | |
|---|---|---|---|
| 10,153,310 B2 * | 12/2018 | Zhang | H01L 31/107 |
| 10,204,950 B1 * | 2/2019 | Yamashita | H01L 27/14621 |
| 10,438,987 B2 * | 10/2019 | Mandai | H04N 25/75 |
| 10,446,601 B2 * | 10/2019 | Otake | H01L 27/14634 |
| 10,580,817 B2 * | 3/2020 | Otake | H01L 31/107 |
| 10,629,765 B2 * | 4/2020 | Wei | H01L 31/1804 |

(Continued)

OTHER PUBLICATIONS

M. Lee, P. Sun, G. Pandraud, C. Bruschini and E. Charbon, "First Near-Ultraviolet- and Blue-Enhanced Backside-Illuminated Single-Photon Avalanche Diode Based on Standard SOI CMOS Technology," in IEEE Journal of Selected Topics in Quantum Electronics, vol. 25, No. 5, pp. 1-6, Sep.-Oct. 2019, Art No. 3800206.

(Continued)

*Primary Examiner* — Mounir S Amer
*Assistant Examiner* — Alexander Belousov
(74) *Attorney, Agent, or Firm* — Thompson Hine LLP; Anthony Canale

(57) ABSTRACT

Structures for a single-photon avalanche diode and methods of forming a structure for a single-photon avalanche diode. The structure includes a semiconductor layer having a first well and a second well defining a p-n junction with the first well, and an interlayer dielectric layer on the semiconductor layer. A deep trench isolation region includes a conductor layer and a dielectric liner. The conductor layer penetrates through the semiconductor layer and the interlayer dielectric layer. The conductor layer has a first end, a second end, and a sidewall that connects the first end to the second end. The dielectric liner is arranged to surround the sidewall of the conductor layer. A metal feature is connected to the first end of the conductor layer.

7 Claims, 8 Drawing Sheets

(56) References Cited

U.S. PATENT DOCUMENTS

| | | | | |
|---|---|---|---|---|
| 10,636,930 | B2* | 4/2020 | Yamashita | H01L 27/14634 |
| 10,658,419 | B2* | 5/2020 | Mandai | H01L 27/14603 |
| 10,672,818 | B2* | 6/2020 | Tanaka | H01L 31/02327 |
| 10,680,028 | B2* | 6/2020 | Kobayashi | H01L 23/5225 |
| 10,777,597 | B2* | 9/2020 | Ogi | H01L 27/14623 |
| 10,804,309 | B2* | 10/2020 | Otake | H01L 27/14609 |
| 11,189,743 | B2* | 11/2021 | Wei | H01L 31/02164 |
| 11,222,916 | B2* | 1/2022 | Kobayashi | H01L 27/14636 |
| 11,239,383 | B2* | 2/2022 | Yamashita | H01L 27/14636 |
| 11,271,031 | B2* | 3/2022 | Mandai | H01L 27/1464 |
| 11,367,747 | B2* | 6/2022 | Von Känel | H01L 27/14689 |
| 11,411,032 | B2* | 8/2022 | Tanaka | H01L 27/14634 |
| 11,424,281 | B2* | 8/2022 | Ogi | H01L 27/1464 |
| 11,508,770 | B2* | 11/2022 | Ishida | H01L 27/14634 |
| 11,508,867 | B2* | 11/2022 | Lu | H01L 27/14636 |
| 11,616,152 | B2* | 3/2023 | Borthakur | H01L 27/14629 257/432 |
| 11,652,176 | B2* | 5/2023 | Borthakur | H01L 27/14629 257/428 |
| 11,670,649 | B2* | 6/2023 | Yagi | H01L 27/1464 250/208.1 |
| 11,699,716 | B2* | 7/2023 | Kobayashi | H01L 27/14636 257/447 |
| 11,742,449 | B2* | 8/2023 | Lu | H01L 27/14634 257/186 |
| 11,754,442 | B2* | 9/2023 | Zhu | H04N 25/772 250/208.2 |
| 11,764,273 | B2* | 9/2023 | Mun | H01L 28/60 257/488 |
| 11,764,314 | B2* | 9/2023 | Borthakur | H01L 27/1463 257/438 |
| 2010/0059843 | A1* | 3/2010 | Ikuta | H01L 27/1464 257/E31.127 |
| 2017/0170216 | A1* | 6/2017 | Lee | H01L 27/1463 |
| 2018/0019268 | A1* | 1/2018 | Zhang | H01L 27/1464 |
| 2018/0090526 | A1* | 3/2018 | Mandai | H01L 27/14609 |
| 2018/0090536 | A1* | 3/2018 | Mandai | H01L 27/14643 |
| 2018/0182806 | A1* | 6/2018 | Jin | H01L 27/14627 |
| 2019/0006399 | A1* | 1/2019 | Otake | H01L 27/14634 |
| 2019/0006548 | A1* | 1/2019 | Wei | H01L 31/1804 |
| 2019/0103504 | A1* | 4/2019 | Yamashita | H01L 27/14636 |
| 2019/0157323 | A1* | 5/2019 | Ogi | H01L 27/14609 |
| 2019/0181177 | A1* | 6/2019 | Kobayashi | H01L 27/14634 |
| 2019/0252442 | A1* | 8/2019 | Tanaka | H01L 27/14623 |
| 2019/0267414 | A1* | 8/2019 | Otake | H01L 27/1461 |
| 2019/0288026 | A1* | 9/2019 | Von Kaenel | H01L 31/1844 |
| 2019/0371853 | A1* | 12/2019 | Von Känel | H01L 23/544 |
| 2020/0091208 | A1* | 3/2020 | Otake | H01L 27/1463 |
| 2020/0203415 | A1* | 6/2020 | Kobayashi | H01L 27/14603 |
| 2020/0212244 | A1* | 7/2020 | Wei | H01L 31/02164 |
| 2020/0227582 | A1* | 7/2020 | Yamashita | H01L 27/14647 |
| 2020/0258930 | A1* | 8/2020 | Tanaka | H01L 27/1464 |
| 2020/0286946 | A1* | 9/2020 | Mandai | G01S 7/4863 |
| 2020/0321369 | A1* | 10/2020 | Otake | H01L 27/14636 |
| 2020/0365629 | A1* | 11/2020 | Ogi | H01L 27/14689 |
| 2021/0175265 | A1* | 6/2021 | Sulfridge | H01L 31/02027 |
| 2021/0175272 | A1* | 6/2021 | Borthakur | H01L 27/1463 |
| 2021/0175376 | A1* | 6/2021 | Borthakur | H01L 31/02327 |
| 2021/0175380 | A1* | 6/2021 | Borthakur | H01L 31/02327 |
| 2021/0193707 | A1* | 6/2021 | Ishida | H01L 27/1463 |
| 2021/0234057 | A1* | 7/2021 | Lu | H01L 27/14636 |
| 2021/0305440 | A1* | 9/2021 | Zang | H01L 31/02027 |
| 2022/0020789 | A1* | 1/2022 | Otake | H01L 27/14607 |
| 2022/0077218 | A1* | 3/2022 | Kobayashi | H01L 27/14636 |
| 2022/0120868 | A1* | 4/2022 | Takatsuka | H01L 27/1462 |
| 2022/0140156 | A1* | 5/2022 | Yagi | G01S 7/4863 356/5.01 |
| 2022/0155153 | A1* | 5/2022 | Zhu | H04N 25/772 |
| 2022/0157867 | A1* | 5/2022 | Kawahara | H01L 27/14685 |
| 2022/0181366 | A1* | 6/2022 | Yagi | H04N 25/702 |
| 2022/0344386 | A1* | 10/2022 | Ogi | H01L 27/14623 |
| 2022/0352234 | A1* | 11/2022 | Kato | H01L 27/14636 |
| 2022/0367743 | A1* | 11/2022 | Lu | H04N 25/76 |
| 2022/0406835 | A1* | 12/2022 | Uehira | H01L 27/14621 |
| 2023/0065063 | A1* | 3/2023 | Zheng | H01L 27/1463 |
| 2023/0131505 | A1* | 4/2023 | Linardy | H01L 27/14629 257/432 |
| 2023/0238405 | A1* | 7/2023 | Shimada | H01L 27/1463 257/431 |
| 2023/0246055 | A1* | 8/2023 | Kobayashi | H01L 27/1464 257/447 |
| 2023/0253420 | A1* | 8/2023 | Yagi | H01L 27/1463 250/208.1 |
| 2023/0253513 | A1* | 8/2023 | Borthakur | H01L 31/02027 257/428 |
| 2023/0261029 | A1* | 8/2023 | Ebiko | H01L 27/1464 257/431 |
| 2023/0268365 | A1* | 8/2023 | Kurata | H01L 27/14607 257/432 |

OTHER PUBLICATIONS

K. Ito et al., "A Back Illuminated 10μm SPAD Pixel Array Comprising Full Trench Isolation and Cu—Cu Bonding with Over 14% PDE at 940nm," 2020 IEEE International Electron Devices Meeting (IEDM), 2020, pp. 16.6.1-16.6.4.

S. Lindner, S. Pellegrini, Y. Henrion, B. Rae, M. Wolf and E. Charbon, "A High-PDE, Backside-Illuminated SPAD in 65/40-nm 3D IC CMOS Pixel With Cascoded Passive Quenching and Active Recharge," in IEEE Electron Device Letters, vol. 38, No. 11, pp. 1547-1550, Nov. 2017.

* cited by examiner

SINGLE-PHOTON AVALANCHE DIODES WITH DEEP TRENCH ISOLATION

BACKGROUND

The present invention relates to semiconductor device fabrication and integrated circuits and, more specifically, to structures for a single-photon avalanche diode and methods of forming a structure for a single-photon avalanche diode.

A single-photon avalanche diode (SPAD) is a type of solid-state photodetector belonging to the same family as photodiodes and avalanche photodiodes. A fundamental difference between single-photon avalanche diodes and other types of photodetectors is that a single-photon avalanche diode is biased well above its reverse-bias breakdown voltage. When a single-photon avalanche diode is placed under such a high reverse bias, photon-initiated charge carriers are accelerated by the electric field to a kinetic energy that is large enough to knock electrons out of atoms of the bulk material and generate additional charge carriers that may exponentially grow to generate an avalanche of charge carriers. A single-photon avalanche diode can detect single photons providing short duration current pulses that can be counted or used to obtain a time of arrival of a particular incident single photon.

Processes for fabricating a single-photon avalanche diode are subject to certain limitations. For example, a backside-illuminated single-photon avalanche diode may necessarily include a top metal layer that is used for device biasing. Overlay errors can occur between the top metal layer and features of the backside-illuminated single-photon avalanche diode. As another example, process variations associated with forming the top metal layer can restrict pixel size.

Improved structures for a single-photon avalanche diode and methods of forming a structure for a single-photon avalanche diode are needed.

SUMMARY

In an embodiment of the invention, a structure for a single-photon avalanche detector is provided. The structure includes a semiconductor layer having a first well and a second well defining a p-n junction with the first well, and an interlayer dielectric layer on the semiconductor layer. A deep trench isolation region includes a conductor layer and a dielectric liner. The conductor layer penetrates through the semiconductor layer and the interlayer dielectric layer. The conductor layer has a first end, a second end, and a sidewall that connects the first end to the second end. The dielectric liner is arranged to surround the sidewall of the conductor layer. A metal feature is connected to the first end of the conductor layer.

In an embodiment of the invention, a method of forming a structure for a single-photon avalanche detector is provided. The method includes forming a first well in a semiconductor layer, forming a second well in the semiconductor layer that defines a p-n junction with the first well, forming an interlayer dielectric layer on the semiconductor layer, and forming a deep trench isolation region including a dielectric liner and a conductor layer. The conductor layer penetrates through the semiconductor layer and the interlayer dielectric layer. The conductor layer has a first end, a second end, and a sidewall that connects the first end to the second end, and the dielectric liner is arranged to surround the sidewall of the conductor layer. The method further includes forming a metal feature connected to the first end of the conductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

FIG. 3A is a top view in which FIG. 3 is taken generally along line 3-3.

DETAILED DESCRIPTION

Figure 1:
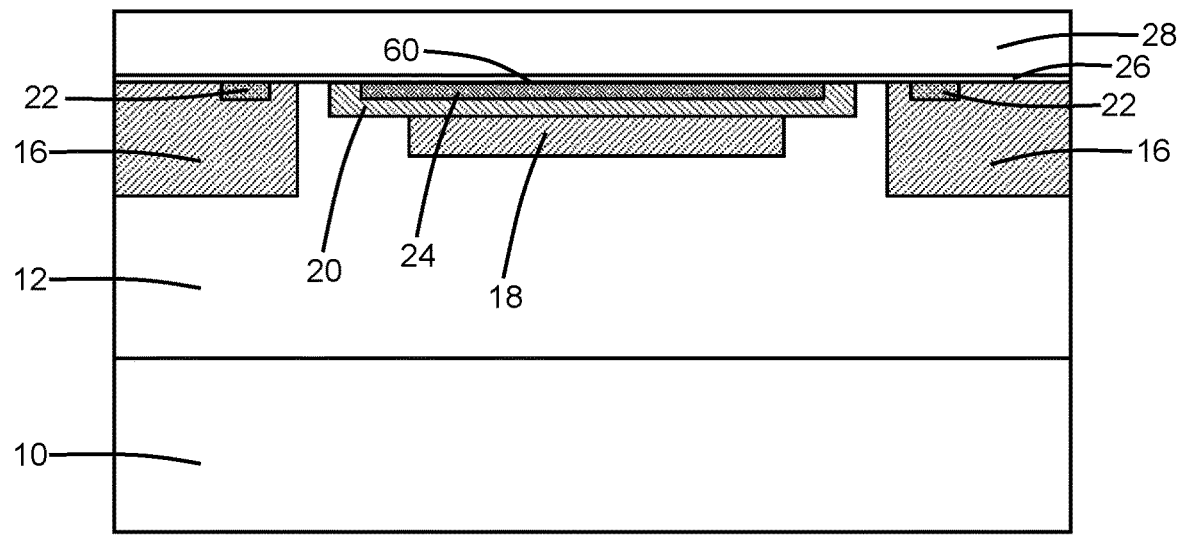
FIG. 1 is a cross-sectional view of a structure at an initial fabrication stage of a processing method in accordance with embodiments of the invention.

With reference to FIG. 1 and in accordance with embodiments of the invention, a semiconductor substrate 10 is provided that contains a semiconductor material, such as single-crystal silicon. In an embodiment, the semiconductor substrate 10 may contain single-crystal silicon that is heavily-doped with a p-type dopant (e.g., boron) to provide p-type conductivity. A semiconductor layer 12 is formed on the semiconductor substrate 10. The semiconductor layer 12 may be comprised of a semiconductor material, such as single-crystal silicon, that is epitaxially grown as a blanket film using an epitaxial growth process. In an embodiment, the semiconductor layer 12 may comprise single-crystal silicon that is doped to have p-type conductivity with a dopant concentration that is less than a dopant concentration of the semiconductor substrate 10. In an embodiment, the semiconductor substrate 10 may have a dopant concentration on the order of $1\times10^{18}$ cm$^{-3}$, and the semiconductor layer 12 may have a significantly lower dopant concentration on the order of $1\times10^{14}$ cm$^{-3}$.

Wells 16, 18, and 20 are formed in the semiconductor layer 12 adjacent to a surface 60 of the semiconductor layer 12. In an embodiment, the well 16 may be formed in a peripheral portion of the semiconductor layer 12 and may be ring-shaped to surround a central portion of the semiconductor layer 12. The well 16 may be formed by, for example, selective ion implantation process using an implantation mask with an opening that determines the portion of the semiconductor layer 12 targeted to be implanted with ions. The implantation mask may include a layer of a light-sensitive material, such as a photoresist, applied by a spin-coating process, pre-baked, exposed to light projected through a photomask, baked after exposure, and developed with a chemical developer to define an opening arranged over a portion of the semiconductor layer 12 to be targeted for implantation to form the well 16. The implantation conditions (e.g., ion species, dose, kinetic energy) may be selected to tune the electrical and physical characteristics of the well 16. The implantation mask, which has a thickness adequate to stop the ions, may be stripped after forming the well 16. In an embodiment, the semiconductor material of the well 16 may receive and contain a p-type dopant (e.g., boron) that provides p-type conductivity.

The well 18 may be formed in a central portion of the semiconductor layer 12. The well 18 may be formed by, for example, selective ion implantation process using an implantation mask with an opening that determines the portion of the semiconductor layer 12 targeted to be implanted with ions. The implantation mask may include a layer of a light-sensitive material, such as a photoresist, applied by a spin-coating process, pre-baked, exposed to light projected through a photomask, baked after exposure, and developed with a chemical developer to define an opening arranged over a portion of the semiconductor layer 12 to be targeted for implantation to form the well 18. The implantation conditions (e.g., ion species, dose, kinetic energy) may be selected to tune the electrical and physical characteristics of the well 18. The implantation mask, which has a thickness adequate to stop the ions, may be stripped after forming the well 18. In an embodiment, the semiconductor material of the well 18 may receive and contain a p-type dopant (e.g., boron) that provides p-type conductivity.

The well 20 may be formed in a central portion of the semiconductor layer 12. The well 20 is positioned in a vertical direction between the well 18 and the surface 60 of the semiconductor layer 12. The well 18 and the well 20 are doped to have opposite conductivity types. The well 20 adjoins the well 18 along a p-n junction that, during operation of the single-photon avalanche diode, may be reversed biased. The well 20 may be formed by, for example, selective ion implantation process using an implantation mask with an opening that determines the portion of the semiconductor layer 12 targeted to be implanted with ions. The implantation mask may include a layer of a light-sensitive material, such as a photoresist, applied by a spin-coating process, pre-baked, exposed to light projected through a photomask, baked after exposure, and developed with a chemical developer to define an opening arranged over a portion of the semiconductor layer 12 to be targeted for implantation to form the well 20. The implantation conditions (e.g., ion species, dose, kinetic energy) may be selected to tune the electrical and physical characteristics of the well 20. The implantation mask, which has a thickness adequate to stop the ions, may be stripped after forming the well 20. In an embodiment, the semiconductor material of the well 20 may receive and contain an n-type dopant (e.g., arsenic or phosphorus) that provides n-type conductivity.

In alternative embodiments, the wells 16, 18, 20 may be altered to provide a different arrangement. In an embodiment, the wells 18, 20 may be re-dimensioned such that the well 20 is embedded within the well 18 beneath the surface 60 of the semiconductor layer 12. In an embodiment, an additional well with the same conductivity type as the well 20 may be added as a guard ring.

A doped region 22 may be formed in a portion of the well 16, and a doped region 24 may be formed in a central portion of the well 20. The doped region 22 may be heavily-doped to have the same conductivity type as, and a higher dopant concentration than, the well 16. The doped region 24 may be heavily-doped to have the same conductivity type as, and a higher dopant concentration than, the well 20. The doped regions 22, 24 may be formed by respective selective ion implantation processes.

A silicide layer 26 may be formed on the surface 60 of the semiconductor substrate 10. The silicide layer 26 may be formed by a silicidation process involving the deposition of a layer of a silicide-forming metal by, for example, chemical vapor deposition or physical vapor deposition, followed by one or more annealing steps (e.g., rapid thermal annealing). The annealing steps form a silicide phase by causing the layer of silicide-forming metal to react with the contacted semiconductor material of the semiconductor substrate 10. Residual silicide-forming metal remaining after forming the silicide layer 26 may be removed by wet chemical etching. In an embodiment, the silicide-forming metal may comprise nickel or cobalt.

In an embodiment, the silicide layer 26 may be arranged on the surface 60 of the semiconductor substrate 10 localized over the doped region 24 and over the doped region 22. A silicide-block layer comprised of, for example, silicon nitride may be formed over other portions of the surface 60 of the semiconductor substrate 10 to prevent silicide formation on these other portions.

An interlayer dielectric layer 28 is deposited on the silicide layer 26. The interlayer dielectric layer 28 may be comprised of dielectric material, such as silicon dioxide, that is deposited by chemical vapor deposition. The interlayer dielectric layer 28 has a surface 29 that is opposite to the surface in contact with the silicide layer 26.

Figure 2:
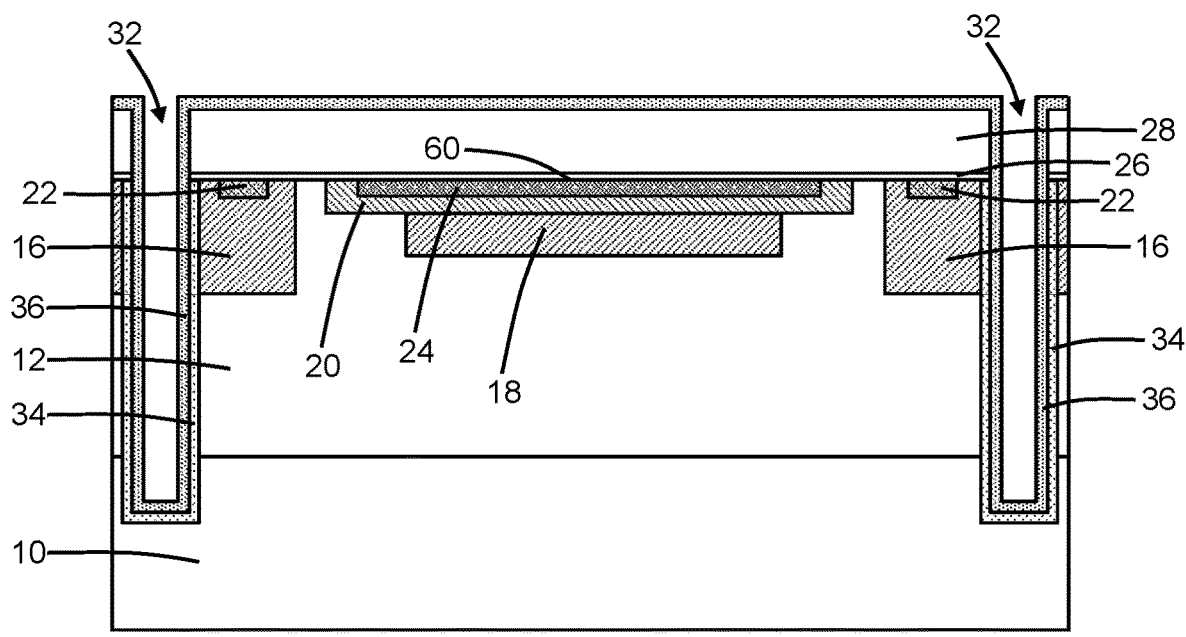
FIG. 2 is a cross-sectional view of the structure at a fabrication stage subsequent to FIG. 1.

With reference to FIG. 2 in which like reference numerals refer to like features in FIG. 1 and at a subsequent fabrication stage of the processing method, a trench 32 is formed as an opening that penetrates fully through the interlayer dielectric layer 28 and the semiconductor layer 12 to the semiconductor substrate 10. The well 16 is intersected by the trench 32, and the trench 32 also penetrates through the silicide layer 26. The trench 32 is ring-shaped and surrounds respective portions of the semiconductor substrate 10 and the semiconductor layer 12 that eventually define an absorption/multiplication region of the single-photon avalanche diode.

The trench 32 may be patterned by lithography and etching processes. To that end, an etch mask may be formed by a lithography process over the semiconductor layer 12. The etch mask may include a layer of a light-sensitive material, such as a photoresist, applied by a spin-coating process, pre-baked, exposed to light projected through a photomask, baked after exposure, and developed with a chemical developer to define an opening at the location of the subsequently-etched trench 32. An etching process is used to form the trench 32 at the location of the opening in the etch mask. In an embodiment, the trench 32 may have a width of about 0.6 microns (μm) and a depth in a range of about 5.5 μm to about 7.5 μm. The etch mask may be stripped by, for example, ashing after forming the trench 32.

A pinning layer 34 is formed that surrounds the sidewalls and bottom of the trench 32. In an embodiment, the pinning layer 34 may be located in portions of the semiconductor substrate 10 and the semiconductor layer 12 that collectively surround the trench 32. The pinning layer 34 may be formed by angled (i.e., tilted) ion implantation of the semiconductor material of the semiconductor substrate 10 and semiconductor layer 12. In an embodiment, a sacrificial oxide layer may be formed on the sidewalls of the trench 32 before implantation and then removed after implantation. In an embodiment, the pinning layer 34 may comprise semiconductor material of the semiconductor substrate 10 and semiconductor material of the semiconductor layer 12 that is doped by ion implantation to contain a p-type dopant (e.g., boron). In an embodiment, the pinning layer 34 may be heavily doped with the p-type dopant. The dopant contained in the pinning layer 34 may be activated by thermal or laser annealing.

A dielectric liner 36 is formed on the sidewalls of the interlayer dielectric layer 28, the sidewall and bottom of the trench 32, and on the surface 29 of the interlayer dielectric layer 28. The dielectric liner 36 may be comprised of, for example, silicon dioxide, and the dielectric liner 36 may have a conformal thickness.

Figure 3:
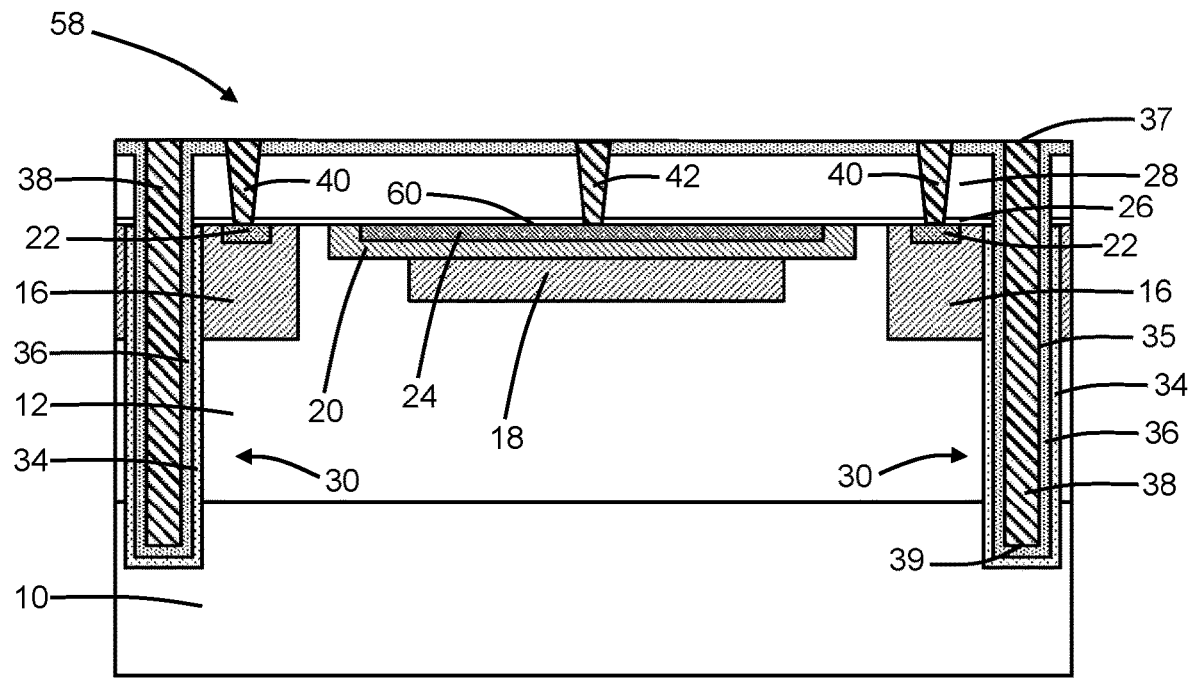
FIG. 3 is a cross-sectional view of the structure at a fabrication stage subsequent to FIG. 2.
Figure 3A:
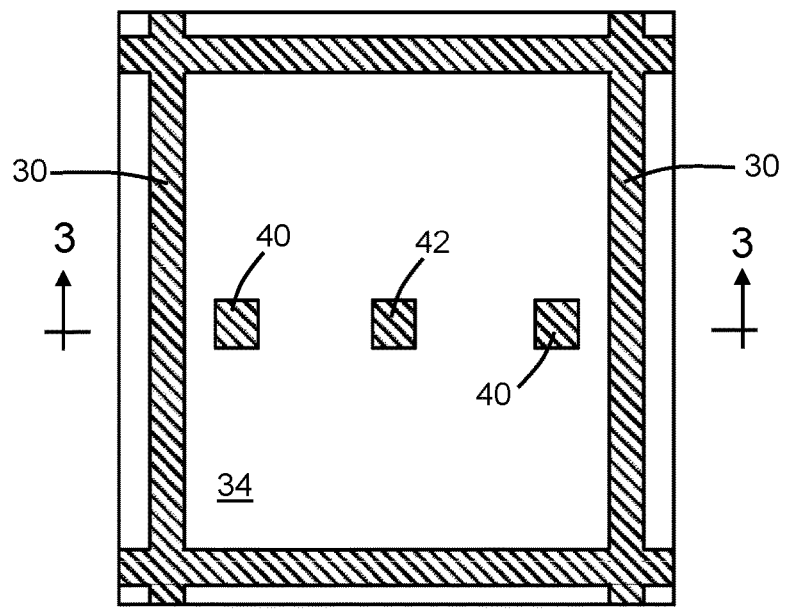

With reference to FIGS. 3, 3A in which like reference numerals refer to like features in FIG. 2 and at a subsequent fabrication stage of the processing method, a conductor layer 38 is formed inside the trench 32 as a core interior of the dielectric liner 36. The conductor layer 38 may be comprised of a metal, such as tungsten, that is deposited and planarized by chemical-mechanical polishing. The conductor layer 38 has an end 37, an end 39 opposite to the end 37, and a sidewall 35 that connects the end 37 to the end 39. The opposite ends 37, 39 terminate the conductor layer 38. The dielectric liner 36 is arranged in the trench 32 between the sidewall 35 of the conductor layer 38 and the semiconductor layer 12, and is also arranged between the sidewall 35 of the conductor layer 38 and the interlayer dielectric layer 28. The sidewall 35 of the conductor layer 38 is surrounded by the dielectric liner 36. The conductor layer 38 may be deposited by chemical vapor deposition and planarized by chemical-mechanical polishing.

The dielectric liner 36 and conductor layer 38 that are positioned in the trench 32 collectively define a deep trench isolation region 30. The conductor layer 38 is electrically isolated by the dielectric liner 36 from the portions of the semiconductor substrate 10 and the semiconductor layer 12 that are surrounded by the deep trench isolation region 30. The pinning layer 34 also surrounds the sidewall 35 of the conductor layer 38 and is electrically isolated from the conductor layer 38 by the dielectric liner 36.

Contacts 40, 42 are formed that are respectively coupled to the doped regions 22, 24. The contacts 40, 42 may be formed by patterning contact openings that extend through the interlayer dielectric layer 28 to the respective doped regions 22, 24 before the conductor layer 38 is formed inside the trench 32, and then filling the contact openings with portions of the deposited metal from the formation of the conductor layer 38 in the trench 32. The contact openings used to form the contacts 40, 42 are patterned separately from the trench 32 using a different lithographically-formed etch mask, and the trench 32 may be protected against further deepening or widening by the etch mask when the contact openings for the contacts 40, 42 are etched.

The resulting structure 58 is a single-photon avalanche diode that is capable of sensing low levels of light. The structure 58 includes an anode provided by the semiconductor layer 10a, the semiconductor layer 12, and the well 18. The structure 58 includes a cathode provided by the well 20. The surrounded portions of the semiconductor layers 10a, 12 define an absorption/multiplication region of the structure 58. As shown in FIG. 3A, the deep trench isolation region 30 may be included in a grid of deep trench isolation regions 30 in which each grid square includes a structure 58.

Figure 4:
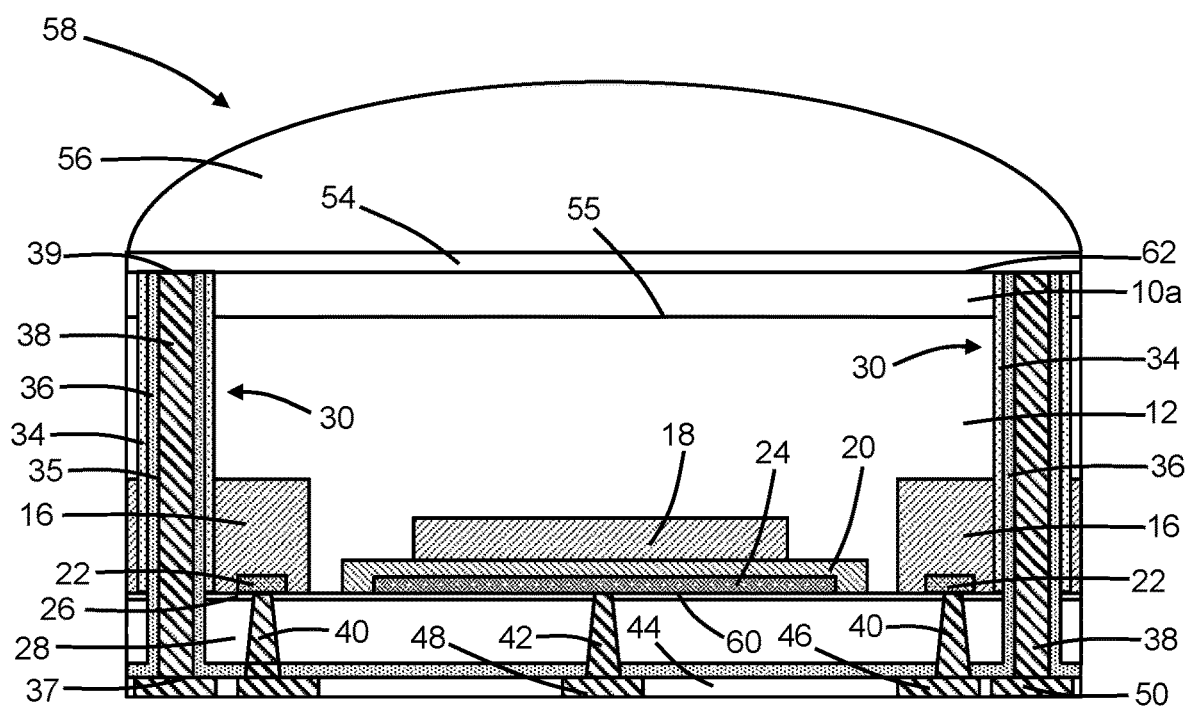
FIG. 4 is a cross-sectional view of the structure at a fabrication stage subsequent to FIG. 3.

With reference to FIG. 4 in which like reference numerals refer to like features in FIG. 3 and at a subsequent fabrication stage of the processing method, an interlayer dielectric layer 44 is deposited on the interlayer dielectric layer 28.

The interlayer dielectric layer 44 may be comprised of dielectric material, such as silicon dioxide, that is deposited by chemical vapor deposition. Wires 46, 48 are formed defining metal features that are physically and electrically connected by the contacts 40, 42 to the doped regions 22, 24. A wire 50 is formed defining a metal feature that is physically and electrically connected to the end 37 of the conductor layer 38 of the deep trench isolation region 30. In an embodiment, the wire 50 may be directly connected to the end 37 of the conductor layer 38 without a separate intervening contact similar to contacts 40, 42. The wire 50 is also electrically connected to the pinning layer 34. The wires 46, 48, 50 may be metal features of a back-end-of-line interconnect structure and may be formed in the interlayer dielectric layer 44 by a damascene process.

The structure 58 may be replicated to provide multiple instances of the single-photon avalanche diode, and these instances of the single-photon avalanche diode may be arranged as pixels in a pixel array to define an image sensor. The image sensor may be used in mobile phones, digital cameras, and other types of devices. The image sensor including multiple instances of the structure 58 may be attached to another chip. In that regard, the structure 58 may be connected by the wires 46, 48, 50 to logic circuitry on the attached chip and to one or more power supplies.

The semiconductor substrate 10 may be thinned by, for example, grinding from its backside and flipped. The thinning is limited and controlled in terms of material removal such that the semiconductor substrate 10 is not fully removed and, as a result, such that a portion of the semiconductor substrate 10 remains as a residual semiconductor layer 10a. After thinning and flipping, the semiconductor layer 10a has a surface 62 at a back side of the structure 58 opposite to the surface 60 of the semiconductor layer 12 at a front side of the structure 58. The dielectric liner 36 is removed from the end 39 of the conductor layer 38 of the deep trench isolation region 30. In that regard, the end 39 of the conductor layer 38 terminates at the surface 62 of the semiconductor layer 10a, and the end 39 of the conductor layer 38 is coplanar or substantially coplanar with the surface 62. The opposite end 37 of the conductor layer 38 is connected to the wire 50. The semiconductor layer 10a and the semiconductor layer 12 are coextensive along an interface 55 between the semiconductor layer 10a and the semiconductor layer 12. The interface 55 is arranged between the surface 60 and the surface 62. The conductor layer 38 penetrates through the interface 55. In an embodiment, the end 39 of the conductor layer 38 is free of the dielectric liner 36 at the surface 62.

The pinning layer 34 also intersects, and terminates at, the surface 62, and is electrically and physically coupled to the well 16. The pinning layer 34 extends from the surface 60 to the surface 62.

The pinning layer 34 and the deep trench isolation region 30 are formed before the semiconductor substrate 10 is thinned and flipped in the process flow. This process flow sequence differs from conventional process flows in which the pinning layer is formed after the semiconductor substrate is thinned and flipped and in which activation of the dopant in the pinning layer, after thinning, can adversely affect the doping profile of the device wells of the single-photon avalanche diode.

The semiconductor layer 10a defines a buried layer with a high doping level (e.g., heavily-doped p-type conductivity) that is attributable to the high doping level of the semiconductor substrate 10. The existence of the semiconductor layer 10a avoids the need, for example, to form a similar highly-doped layer by ion implantation before flipping and thinning. The semiconductor layer 10a and the semiconductor layer 12 are doped to have the same conductivity type, and the dopant concentration in the semiconductor layer 10a is greater than the dopant concentration in the semiconductor layer 12.

After flipping, a coating 54 and a micro-lens 56 may be formed on the surface 62. The coating 54 may include an anti-reflection layer and a passivation layer arranged in a layer stack. In such a backside illuminated structure, the micro-lens 56 may function to focus incident light toward the absorption/multiplication region of the single-photon avalanche diode. The micro-lens 56 may be comprised of a polymer, such as reflowed photoresist, or may be comprised of a dielectric material, such as silicon dioxide or silicon nitride.

The deep trench isolation region 30 electrically and optically isolates the anode and cathode of the structure 58 from adjacent instances of the structure 58 in the pixel array. The isolation may reduce or prevent optical crosstalk and electrical crosstalk between adjacent structures 58 in the pixel array. The deep trench isolation region 30 extends from the wire 50 fully through the interlayer dielectric layer 28, the semiconductor layer 12, and the semiconductor layer 10a to the surface 62. The deep trench isolation region 30 may be subjected to direct bias control to improve the performance of the single-photon avalanche diode. The bias control is achieved without the use of a metal grid at the back side of the structure 58. The elimination of the metal grid avoids overlay error between the metal grid and the conductor layer 38 of the deep trench isolation region 30, and also mitigates limitations of process variations in forming the metal grid on pixel size.

In use, the p-n junction between the well 18 and the well 20 is reverse-biased above the breakdown voltage. The structure 58 is illuminated by light, which is directed by the micro-lens 56 toward the surface 62. Incident photons are absorbed in the portions of the semiconductor layers 10a, 12 interior of the deep trench isolation region 30. When an incident photon is absorbed, an electron-hole pair is created, and an avalanche current is generated under the reverse bias by the creation of additional electron-hole pairs through impact ionization with atoms of the semiconductor material. The current continues to flow until the avalanche is quenched by lowering the bias to less than or equal to the breakdown voltage. The collected avalanche current provides a detectable electronic signal. In order to be able to detect another photon, the reverse bias is raised again above breakdown voltage.

Figure 5:
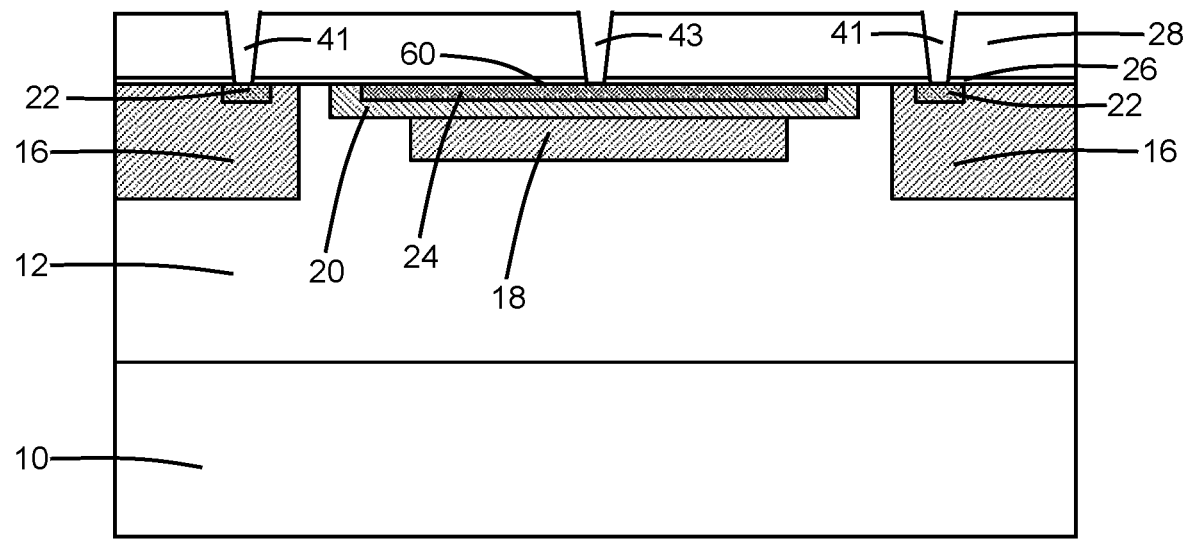
FIGS. 5-8 are cross-sectional views of a structure at successive fabrication stages of a processing method in accordance with alternative embodiments of the invention.

With reference to FIG. 5 and in accordance with alternative embodiments, contact openings 41, 43 for the contacts 40, 42 may be patterned in the interlayer dielectric layer 28 and extended through the silicide layer 26 before the trench 32 for the deep trench isolation region is patterned.

Figure 6:
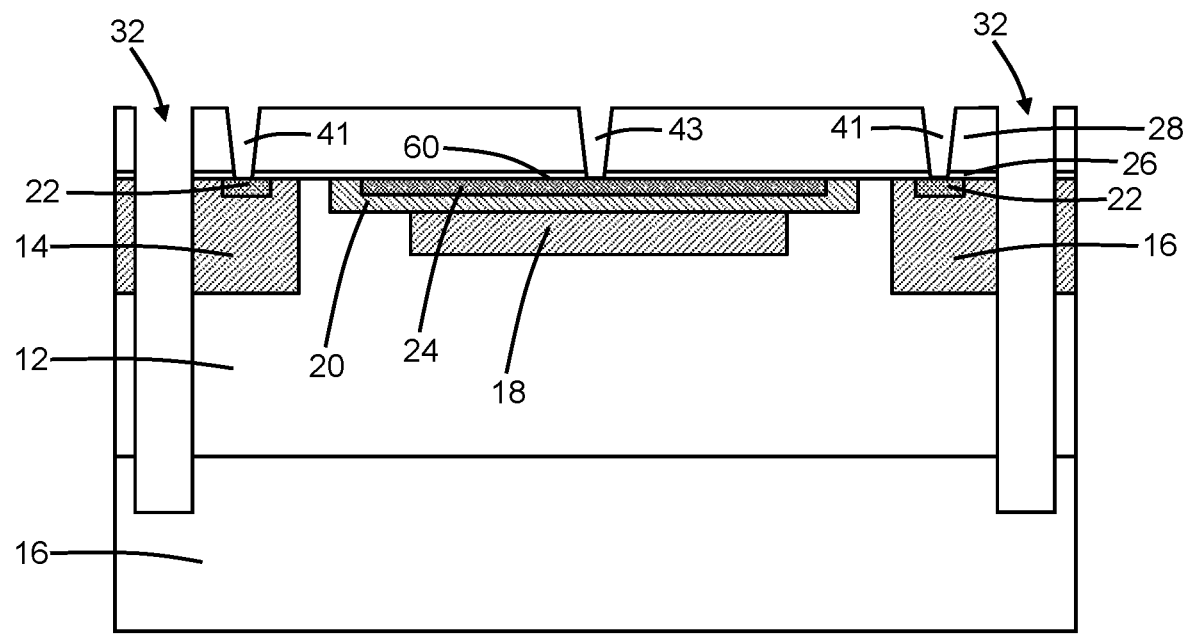

With reference to FIG. 6 in which like reference numerals refer to like features in FIG. 5 and at a subsequent fabrication stage, the trench 32 is patterned after the contact openings 41, 43 are patterned. The contact openings 41, 43 are protected against further deepening and/or widening by the lithographically-formed etch mask used to pattern the trench 32.

Figure 7:
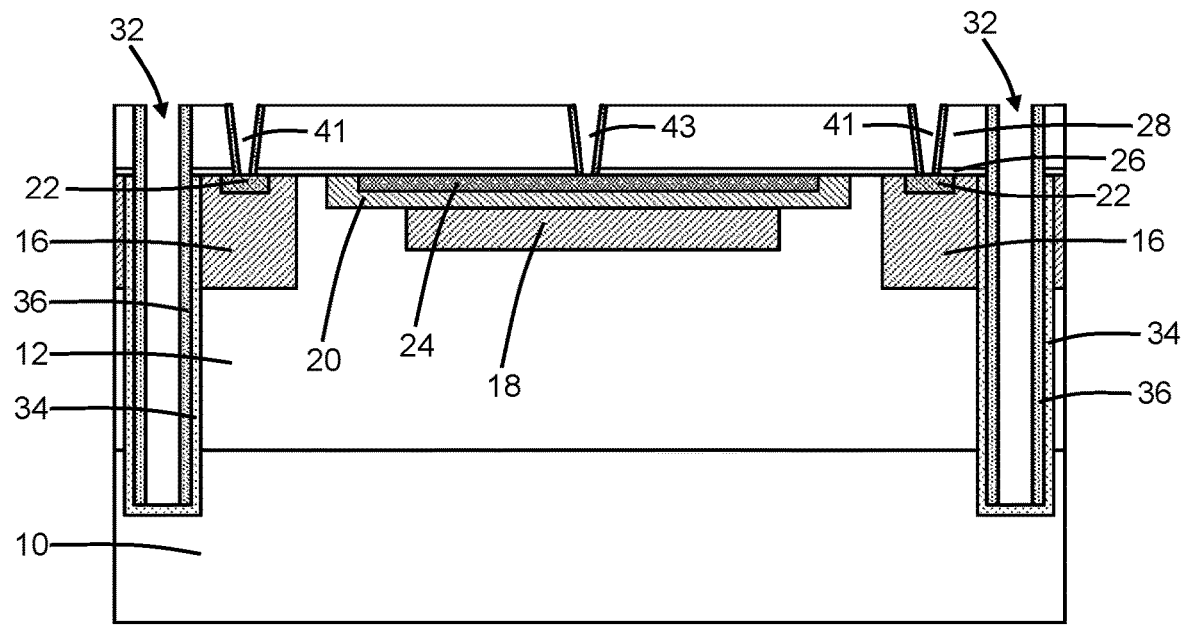

With reference to FIG. 7 in which like reference numerals refer to like features in FIG. 6 and at a subsequent fabrication stage, the process flow continues with the formation of the dielectric liner 36 inside the trench 32 and the formation of the pinning layer 34. An etch-back process is used to remove the dielectric liner 36 from the bottom of the contact openings 41, 43, the bottom of the trench 32, and the top surface of the interlayer dielectric layer 28.

Figure 8:
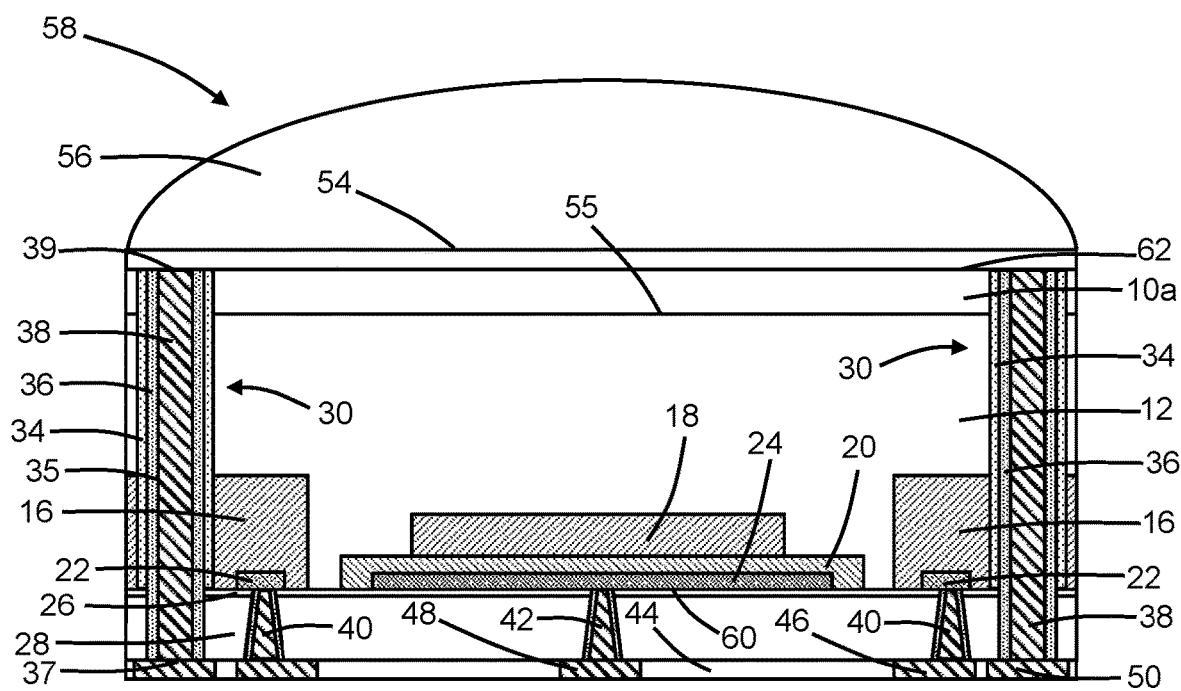

With reference to FIG. 8 in which like reference numerals refer to like features in FIG. 7 and at a subsequent fabrication stage, the conductor layer 38 is formed inside the trench 32, and the contacts 40, 42 are concurrently formed inside the contact openings 41, 43. The process flow continues to form the structure 58 in which the dielectric liner 36 is absent between the interlayer dielectric layer 28 and the interlayer dielectric layer 44.

Figure 9:
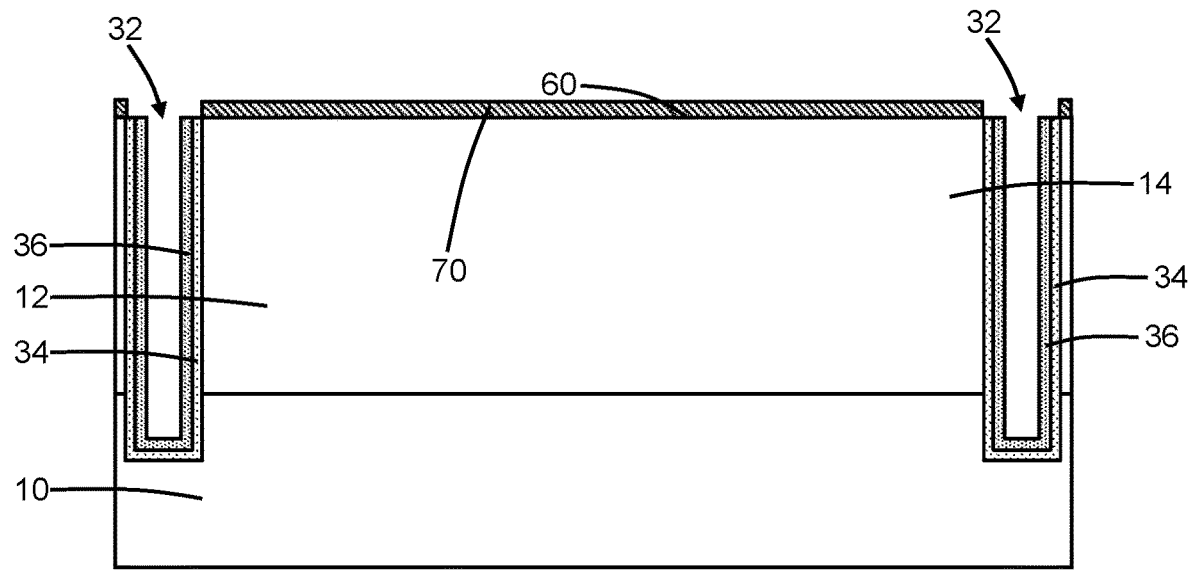
FIGS. 9-12 are cross-sectional views of a structure at successive fabrication stages of a processing method in accordance with alternative embodiments of the invention.

With reference to FIG. 9 and in accordance with alternative embodiments, a hardmask 70 may be applied to the semiconductor layer 12 and patterned to form an opening at the intended location for the trench 32. The trench 32 is then etched. In an embodiment, the pinning layer 34 may be epitaxially grown as a layer of semiconductor material from the sidewall of the trench 32. In an embodiment, the semiconductor material forming the pinning layer 34 may be in situ doped during epitaxial growth. In an embodiment, the pinning layer 34 may be heavily-doped with a p-type dopant (e.g., boron) to provide p-type conductivity. The hardmask 70, which blocks epitaxial growth from the surface 60 of the semiconductor layer 12, is removed after the pinning layer 34 is epitaxially grown. In an alternative embodiment, the pinning layer 34 may be formed by tilted ion implantation of the semiconductor substrate 10 and semiconductor layer 12, as described in connection with FIG. 2.

Figure 10:
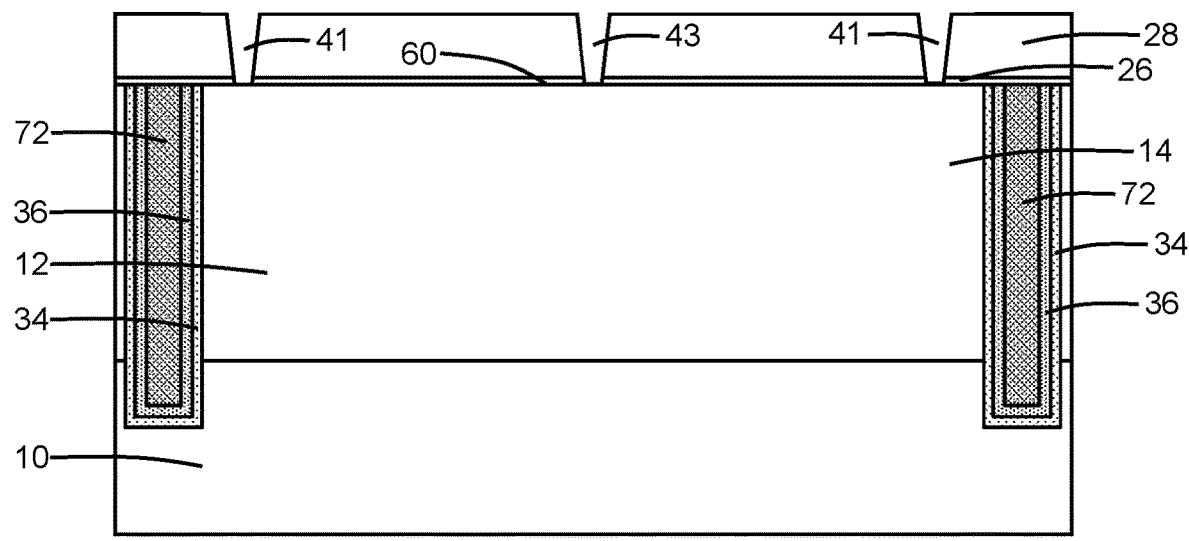

With reference to FIG. 10 in which like reference numerals refer to like features in FIG. 9 and at a subsequent fabrication stage, the trench 32 is filled with a plug 72 containing a sacrificial material, such as silicon dioxide or polysilicon. The silicide layer 26 and interlayer dielectric layer 28 are formed, followed by the patterning of the contact openings 41, 43 in the interlayer dielectric layer 28.

Figure 11:
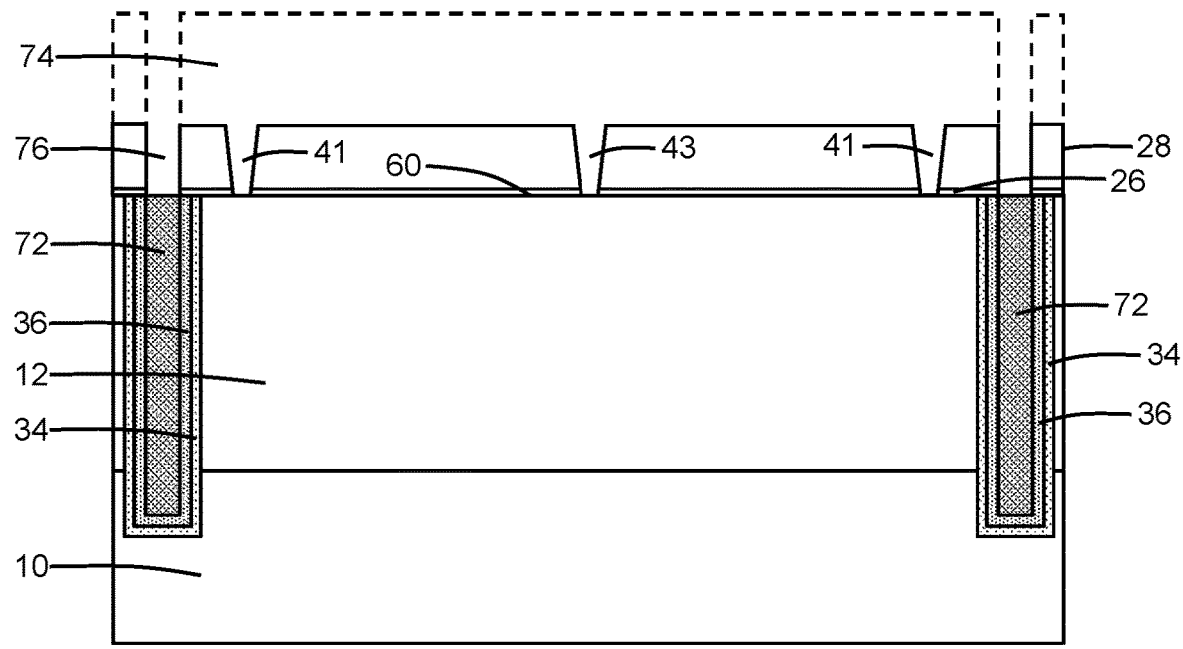

With reference to FIG. 11 in which like reference numerals refer to like features in FIG. 10 and at a subsequent fabrication stage, an etch mask 74 is applied, and an opening 76 is patterned in the interlayer dielectric layer 28 and is extended through the silicide layer 26. The opening 76 in the interlayer dielectric layer 28 is aligned with the plug 72 of sacrificial material. An etching process is subsequently used to remove the plug 72, followed by the removal of the etch mask 74. The etching process may be anisotropic such that the dielectric liner 36 is not removed from the trench 32. The doped epitaxial semiconductor layer, which occupies a portion of the trench 32 before the dielectric liner 36 and conductor layer 38 are formed, providing the pinning layer 34 is positioned between the dielectric liner 36 and the semiconductor layer 12 surrounding the trench 32.

Figure 12:
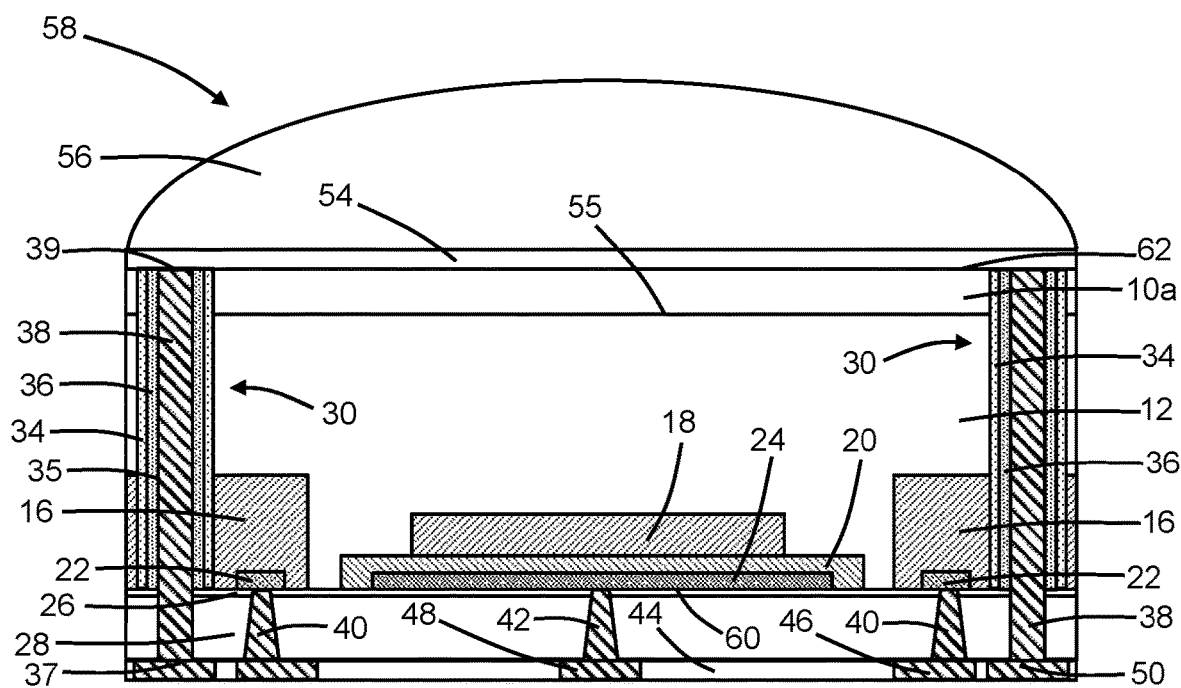

With reference to FIG. 12 in which like reference numerals refer to like features in FIG. 11 and at a subsequent fabrication stage, the conductor layer 38 is formed inside the trench 32 and the contacts 40, 42 are concurrently formed inside the contact openings 41, 43. The process flow continues to form the structure 58 in which the dielectric liner 36 is absent between the interlayer dielectric layer 28 and the interlayer dielectric layer 44. In addition, the dielectric liner 36 is absent between the conductor layer 38 and the interlayer dielectric layer 44, and is only present between the conductor layer 38 and the semiconductor layers 10a, 12.

Figure 13:
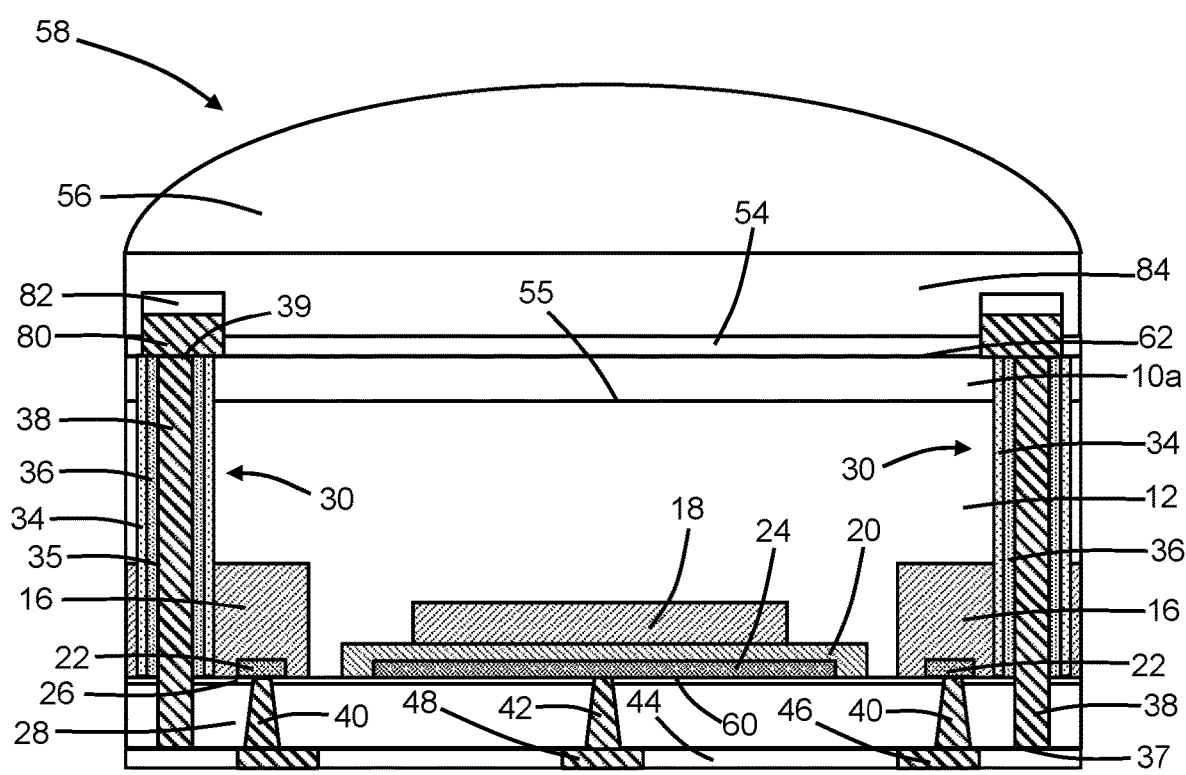
FIG. 13 is a cross-sectional view of a structure in accordance with alternative embodiments of the invention.

With reference to FIG. 13 and in accordance with alternative embodiments, the conductor layer 38 penetrates through the interlayer dielectric layer 28 to the end 37, but the wire 50 is not formed in the interlayer dielectric layer 44 and the end 37 is not connected to a wire in the interconnect structure of the structure 58. Instead, a wire 80 comprised of a metal is formed as a metal feature on the surface 62 and is connected to the end 39 of the conductor layer 38. A passivation cap 82 comprised of a dielectric material is arranged over the wire 80, and a polymer layer 84 is formed over the wire 80 and passivation cap 82 before the micro-lens 56 is formed.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a single-photon avalanche detector, the structure comprising:
   a plurality of semiconductor layers including a first well, a second well defining a p-n junction with the first well, a first surface, and a second surface opposite from the first surface;
   a micro-lens adjacent to the second surface of the semiconductor layers;
   an interlayer dielectric layer on the first surface of the semiconductor layers;
   a deep trench isolation region including a conductor layer and a dielectric liner, the conductor layer including a first portion in the semiconductor layers and a second portion in the interlayer dielectric layer, the conductor layer having a first end, a second end opposite from the first end, and a sidewall that connects the first end to the second end, the second end of the conductor layer coplanar with the second surface of the semiconductor layers, and the dielectric liner arranged to surround the sidewall of the conductor layer; and
   a metal feature directly connected to the first end of the conductor layer,
   wherein the second surface of the semiconductor layers is free of metal.

2. The structure of claim 1 wherein the metal feature is a first wire, and the second portion of the conductor layer is connected at the first end to the first wire.

3. The structure of claim 2 further comprising:
   a contact in the interlayer dielectric layer; and
   a second wire connected by the contact to the first well.

4. The structure of claim 1 wherein the second end of the conductor layer is free of the dielectric liner.

5. The structure of claim 1 wherein the semiconductor layers have a conductivity type, and at least one of the semiconductor layers has a higher dopant concentration than another of the semiconductor layers.

6. The structure of claim 1 wherein the semiconductor layers include a trench, the conductor layer and the dielectric liner are positioned in the trench, and further comprising:
   a doped semiconductor layer inside the trench,
   wherein the doped semiconductor layer defines a pinning layer that is positioned between the dielectric liner and the semiconductor layers surrounding the trench, and the metal feature is directly connected to the doped semiconductor layer.

7. The structure of claim 6 wherein the dielectric liner is positioned between the doped semiconductor layer and the sidewall of the conductor layer.

* * * * *